(12) United States Patent
Fernandez-Orellana et al.

(10) Patent No.: US 11,511,142 B2
(45) Date of Patent: Nov. 29, 2022

(54) FIRE DETECTION SYSTEM—END-TO-END SOLUTION FOR FIRE DETECTION DESIGN FRAMEWORK

(71) Applicant: CARRIER CORPORATION, Palm Beach Gardens, FL (US)

(72) Inventors: Pedro Fernandez-Orellana, Shanghai (CN); Ankit Tiwari, South Windsor, CT (US); Kushal Mukherjee, New Dehli (IN)

(73) Assignee: CARRIER CORPORATION, Palm Beach Gardens, FL (US)

( * ) Notice: Subject to any disclaimer, the term of this patent is extended or adjusted under 35 U.S.C. 154(b) by 0 days.

(21) Appl. No.: 16/973,525

(22) PCT Filed: Sep. 5, 2019

(86) PCT No.: PCT/US2019/049620
§ 371 (c)(1),
(2) Date: Dec. 9, 2020

(87) PCT Pub. No.: WO2020/055645
PCT Pub. Date: Mar. 19, 2020

(65) Prior Publication Data
US 2021/0322806 A1    Oct. 21, 2021

(30) Foreign Application Priority Data

Sep. 13, 2018   (CN) .......................... 201811068968.2

(51) Int. Cl.
*A62C 3/02*       (2006.01)
*G08B 29/18*    (2006.01)
(Continued)

(52) U.S. Cl.
CPC ............ *A62C 3/0214* (2013.01); *A62C 37/00* (2013.01); *G08B 17/10* (2013.01); *G08B 29/185* (2013.01)

(58) Field of Classification Search
CPC ...... A62C 3/0214; A62C 37/00; G08B 17/10; G08B 29/185; G08B 17/00; G08B 29/18; G06Q 50/265; G06F 30/13
See application file for complete search history.

(56) References Cited

U.S. PATENT DOCUMENTS 4,885,694 A    12/1989   Pray et al.
7,378,942 B2    5/2008   Seeley et al.
(Continued)

FOREIGN PATENT DOCUMENTS

CN           107577888 A        1/2018
DE    102012107160 A1 *    11/2013    ............. G06Q 10/04
(Continued)

OTHER PUBLICATIONS

Fire Alarm Design Templte Sample; Youtube (http://www.youtube.com/watch?v=fkmNb8SjnP0); published Jun. 13, 2014.
(Continued)

*Primary Examiner* — Ojiako K Nwugo
(74) *Attorney, Agent, or Firm* — Cantor Colburn LLP (57) ABSTRACT

A method of designing a fire detection system including: determining a location of one or more fire detection devices within the building; and generating a map that displays the location of one or more fire detection device.

14 Claims, 8 Drawing Sheets

(51) Int. Cl.
 *G08B 17/10* (2006.01)
 *A62C 37/00* (2006.01)

(56) References Cited

U.S. PATENT DOCUMENTS

| | | |
|---|---|---|
| 8,532,962 B2 | 9/2013 | Zhang et al. |
| 2003/0097188 A1 | 5/2003 | O'Mahoney et al. |
| 2004/0080407 A1 | 4/2004 | Reghetti et al. |
| 2005/0081161 A1 | 4/2005 | MacInnes et al. |
| 2006/0021759 A1 | 2/2006 | Golinveaux |
| 2007/0103325 A1 | 5/2007 | Wagner et al. |
| 2007/0179758 A1 | 8/2007 | Neumann et al. |
| 2011/0147524 A1 | 6/2011 | Behle et al. |
| 2016/0179315 A1 | 6/2016 | Sarao et al. |
| 2017/0228740 A1* | 8/2017 | Marszal ............... G08B 29/185 |
| 2017/0352259 A1 | 12/2017 | Bruck et al. |
| 2018/0114430 A1* | 4/2018 | Westmacott ......... G08B 29/183 |
| 2018/0121571 A1 | 5/2018 | Tiwari et al. |
| 2018/0308326 A1* | 10/2018 | Miwa ..................... G08B 7/066 |
| 2019/0096232 A1* | 3/2019 | Wedig ................... H04N 7/185 |
| 2020/0388120 A1* | 12/2020 | Paturu ................. G03H 1/0005 |

FOREIGN PATENT DOCUMENTS

| | | |
|---|---|---|
| DE | 102012107160 A1 | 11/2013 |
| EP | 1293945 A1 | 3/2003 |
| JP | 2004206808 A | 7/2004 |
| WO | 2005033912 A2 | 4/2005 |

OTHER PUBLICATIONS

Fire Class; Fire Detection Consultants Guide; Issue 1.2; Tyco Fire Protection Products; pp. 1-280; 2018.

International Search Report for International Application No. PCT/US2019/049620, International Filing Date Sep. 5, 2019, dated Dec. 10, 2019, 6 pages.

Written Opinion for International Application No. PCT/US2019/049620, International Filing Date Sep. 5, 2019, dated Dec. 10, 2019, 8 pages.

Chinese Office Action; dated Apr. 26, 2022; Received: Jul. 8, 2022; Application No. 201811068968.2; filed Sep. 13, 2018; 11 pages.

* cited by examiner

FIRE DETECTION SYSTEM—END-TO-END SOLUTION FOR FIRE DETECTION DESIGN FRAMEWORK

CROSS REFERENCE TO RELATED APPLICATIONS

This application is a National Stage application of PCT/US2019/049620, filed Sep. 5, 2019, which claims the benefit of China Application No. 201811068968.2, filed Sep. 13, 2018, both of which are incorporated by reference in their entirety herein.

BACKGROUND

The subject matter disclosed herein generally relates to the field of fire detection systems, and more specifically, an apparatus and method for designing fire detection systems.

Conventional building fire detections systems consist of distributed components that must be designed, identified, installed, and commissioned in accordance with requirements and regulations. The design process is also a major determinant of the total system cost.

BRIEF SUMMARY

According to one embodiment, a method of designing a fire detection system is provided. The method including: determining a location of one or more fire detection devices within the building; and generating a map that displays the location of one or more fire detection device.

In addition to one or more of the features described above, or as an alternative, further embodiments may include: determining at least one of a location of one or more fire suppression devices and a location of one or more fire escape devices of a fire detection system within the building; and generating a map on a computing device that displays the location of one or more fire detection device and at least one of the location of one or more fire suppression devices and the location of one or more fire escape devices.

In addition to one or more of the features described above, or as an alternative, further embodiments may include: determining whether a constraint is violated by at least one of the location of one or more fire detection device, the location of one or more fire suppression devices, and the location of one or more fire escape devices; and activating an alert when a constraint is violated by at least one of the location of one or more fire detection device, the location of one or more fire suppression devices, and the location of one or more fire escape devices.

In addition to one or more of the features described above, or as an alternative, further embodiments may include: receiving an input from a user that adjusts at least one of the location of one or more fire detection device, the location of one or more fire suppression devices, and the location of one or more fire escape devices.

In addition to one or more of the features described above, or as an alternative, further embodiments may include that after receiving an input from a user, the method further includes: determining whether a constraint is violated by the input from the user that adjusts at least one of the location of one or more fire detection device, the location of one or more fire suppression devices, and the location of one or more fire escape devices; and activating an alert when a constraint is violated by the input from the user that adjusts at least one of the location of one or more fire detection device, the location of one or more fire suppression devices, and the location of one or more fire escape devices.

In addition to one or more of the features described above, or as an alternative, further embodiments may include: determining a location of one or more fire detection devices, a location of one or more fire suppression devices, and a location of one or more fire escape devices of a fire detection system within the building further includes: determining a probability of a fire in each room of the building; determining a number of fire detection devices for the fire detection system within the room in response to the probability of the fire in each room; determining a number of fire suppression devices for the fire detection system within the room in response to the probability of a fire in each room; and determining a location of each of the fire detection devices within the room and a location of the fire suppression devices within each room.

In addition to one or more of the features described above, or as an alternative, further embodiments may include that determining a probability of a fire in each room of the building further includes: determining a geometry of each room in response to a floor plan; determining whether one or more articles are located within each room and a flammability of each of the one or more articles; determining whether one or more hazards are located within each room; and determining a probability of a fire in each room in response to at least one or more articles are located within each room, the flammability of each of the one or more articles, and the one or more hazards are located within each room.

According to another embodiment, a system for designing a fire detection system is provided. The system including: a processor; and a memory including computer-executable instructions that, when executed by the processor, cause the processor to perform operations, the operations including: determining a location of one or more fire detection devices within the building; and generating a map that displays the location of one or more fire detection device.

In addition to one or more of the features described above, or as an alternative, further embodiments may include that the operations further include: determining at least one of a location of one or more fire suppression devices and a location of one or more fire escape devices of a fire detection system within the building; and generating a map on a computing device that displays the location of one or more fire detection device and at least one of the location of one or more fire suppression devices and the location of one or more fire escape devices.

In addition to one or more of the features described above, or as an alternative, further embodiments may include that the operations further include: determining whether a constraint is violated by at least one of the location of one or more fire detection device, the location of one or more fire suppression devices, and the location of one or more fire escape devices; and activating an alert when a constraint is violated by at least one of the location of one or more fire detection device, the location of one or more fire suppression devices, and the location of one or more fire escape devices.

In addition to one or more of the features described above, or as an alternative, further embodiments may include that the operations further include: receiving an input from a user that adjusts at least one of the location of one or more fire detection device, the location of one or more fire suppression devices, and the location of one or more fire escape devices.

In addition to one or more of the features described above, or as an alternative, further embodiments may include that after receiving an input from a user, the operations further include: determining whether a constraint is violated by the input from the user that adjusts at least one of the location of one or more fire detection device, the location of one or more fire suppression devices, and the location of one or more fire escape devices; and activating an alert when a constraint is violated by the input from the user that adjusts at least one of the location of one or more fire detection device, the location of one or more fire suppression devices, and the location of one or more fire escape devices.

In addition to one or more of the features described above, or as an alternative, further embodiments may include that determining a location of one or more fire detection devices, a location of one or more fire suppression devices, and a location of one or more fire escape devices of a fire detection system within the building further includes: determining a probability of a fire in each room of the building; determining a number of fire detection devices for the fire detection system within the room in response to the probability of the fire in each room; determining a number of fire suppression devices for the fire detection system within the room in response to the probability of a fire in each room; and determining a location of each of the fire detection devices within the room and a location of the fire suppression devices within each room.

In addition to one or more of the features described above, or as an alternative, further embodiments may include that determining a probability of a fire in each room of the building further includes: determining a geometry of each room in response to a floor plan; determining whether one or more articles are located within each room and a flammability of each of the one or more articles; determining whether one or more hazards are located within each room; and determining a probability of a fire in each room in response to at least one or more articles are located within each room, the flammability of each of the one or more articles, and the one or more hazards are located within each room.

According to another embodiment, a computer program product tangibly embodied on a computer readable medium is provided. The computer program product including instructions that, when executed by a processor, cause the processor to perform operations including: determining a location of one or more fire detection devices within the building; and generating a map that displays the location of one or more fire detection device.

In addition to one or more of the features described above, or as an alternative, further embodiments may include that the operations further include: determining at least one of a location of one or more fire suppression devices and a location of one or more fire escape devices of a fire detection system within the building; and generating a map on a computing device that displays the location of one or more fire detection device and at least one of the location of one or more fire suppression devices and the location of one or more fire escape devices.

In addition to one or more of the features described above, or as an alternative, further embodiments may include that the operations further include: determining whether a constraint is violated by at least one of the location of one or more fire detection device, the location of one or more fire suppression devices, and the location of one or more fire escape devices; and activating an alert when a constraint is violated by at least one of the location of one or more fire detection device, the location of one or more fire suppression devices, and the location of one or more fire escape devices.

In addition to one or more of the features described above, or as an alternative, further embodiments may include that the operations further include: receiving an input from a user that adjusts at least one of the location of one or more fire detection device, the location of one or more fire suppression devices, and the location of one or more fire escape devices.

In addition to one or more of the features described above, or as an alternative, further embodiments may include that after receiving an input from a user, the operations further include: determining whether a constraint is violated by the input from the user that adjusts at least one of the location of one or more fire detection device, the location of one or more fire suppression devices, and the location of one or more fire escape devices; and activating an alert when a constraint is violated by the input from the user that adjusts at least one of the location of one or more fire detection device, the location of one or more fire suppression devices, and the location of one or more fire escape devices.

In addition to one or more of the features described above, or as an alternative, further embodiments may include that determining a location of one or more fire detection devices, a location of one or more fire suppression devices, and a location of one or more fire escape devices of a fire detection system within the building further includes: determining a probability of a fire in each room of the building; determining a number of fire detection devices for the fire detection system within the room in response to the probability of the fire in each room; determining a number of fire suppression devices for the fire detection system within the room in response to the probability of a fire in each room; and determining a location of each of the fire detection devices within the room and a location of the fire suppression devices within each room.

In addition to one or more of the features described above, or as an alternative, further embodiments may include that determining a probability of a fire in each room of the building further includes: determining a geometry of each room in response to a floor plan; determining whether one or more articles are located within each room and a flammability of each of the one or more articles; determining whether one or more hazards are located within each room; and determining a probability of a fire in each room in response to at least one or more articles are located within each room, the flammability of each of the one or more articles, and the one or more hazards are located within each room.

Technical effects of embodiments of the present disclosure include automatically designing a fire detection system in response to building maps and known constraints.

The foregoing features and elements may be combined in various combinations without exclusivity, unless expressly indicated otherwise. These features and elements as well as the operation thereof will become more apparent in light of the following description and the accompanying drawings. It should be understood, however, that the following description and drawings are intended to be illustrative and explanatory in nature and non-limiting.

BRIEF DESCRIPTION

The following descriptions should not be considered limiting in any way. With reference to the accompanying drawings, like elements are numbered alike.

DETAILED DESCRIPTION

A detailed description of one or more embodiments of the disclosed apparatus and method are presented herein by way of exemplification and not limitation with reference to the Figures.

Figure 1:
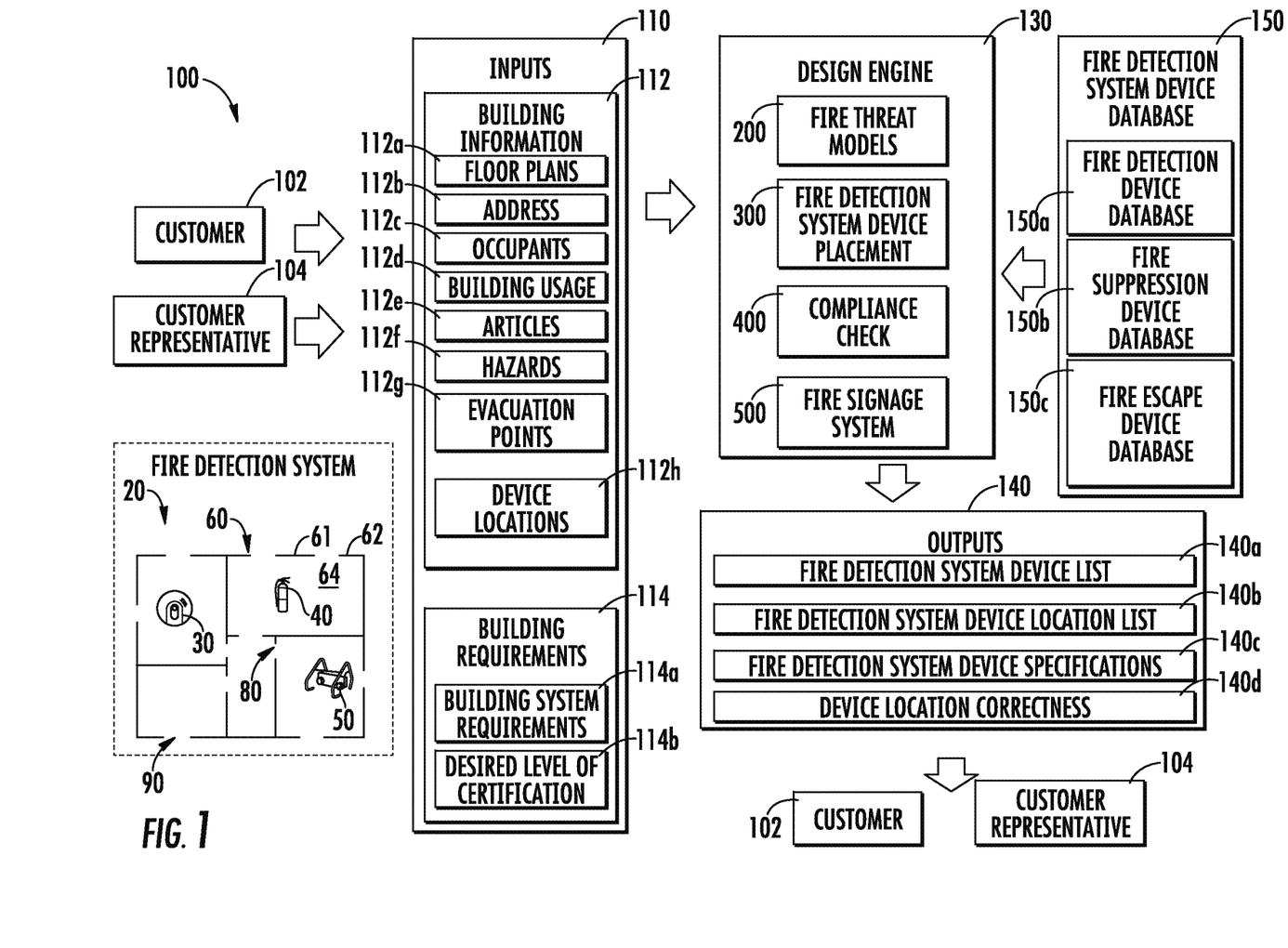
FIG. 1 is a schematic illustration of a system for designing a fire detection system, in accordance with an embodiment of the disclosure.

Referring now to FIG. 1, which shows a schematic illustration of a system 100 for designing a fire detection system 20. It should be appreciated that, although particular systems are separately defined in the schematic block diagrams, each or any of the systems may be otherwise combined or separated via hardware and/or software. In an embodiment, the system 100 for designing a fire detection system 20 may be a web-based system. In an embodiment, the system 100 for designing a fire detection system 20 may be a residential system used for residential homes/buildings. For example, the system 100 may be for a do-it-yourself (DIY) user to design a fire detection for their home via a tablet or any other computer device.

FIG. 1 also shows a schematic illustration of a fire detection system 20, according to an embodiment of the present disclosure. The fire detection system 20 is an example and the embodiments disclosed herein may be applied to other fire detection systems not illustrated herein. The fire detection system 20 comprises one or more fire detection devices 30, one or more fire suppression devices 40, and one or more fire escape devices 50. The fire detection devices 30, the fire suppression devices 40, and the fire escape devices 50 may be located throughout various rooms 64 of a building 62. A map 60 of a single floor 61 of a building 62 is shown in FIG. 1. It is understood that while the building 62 only shows one fire detection device 30, one fire suppression device 40, and one fire escape device 50, the fire detection system may include any number of fire detection devices 30, fire suppression devices 40, and fire escape devices 50.

The fire detection device 30 may be a smoke detector, a $CO_2$ detector, a CO detector, a heat sensor, or any other fire detector known to one of skill in the art. The fire suppression devices 40 may be a fire extinguisher, fire extinguishing sand, a water hose, a fire blanket, or any other fire suppression device known to one of skill in the art. The fire escape devices 50 may be a fire ladder, a fire fighting ax, fire egress signaling, or any other fire escape device known to one of skill in the art.

As discussed below, the system 10 is configured to determine placement of fire detection devices 30 of a fire detection system 20 within a room 64; determine placement of fire suppression devices 40 of the fire detection system 20 within the room 64; and determine fire escape devices 50 within a room 64. The system 10 is configured to determine whether placement of any of the fire detection devices 30, fire suppression devices 40, and fire escape devices 50 violate any constraints and then generate a map 60 displaying the locations of each fire detection device 30, each fire suppression device 40, and each fire escape device 50.

The system 10 comprises a plurality of inputs 110 that are entered into a design engine 130 configured to determine outputs 140 in response to the inputs 110. The inputs 110 may be entered manually, such as, for example, a customer 102 and/or customer representative 104 entering in the inputs 110 through a computing device. The inputs 110 may also be entered automatically, such as, for example a customer 102 and/or customer representative 104 scanning or emailing in the inputs 110.

The inputs 110 may include but are not limited to building information 112 and building requirements 114, as shown in FIG. 1. Building information 112 may include but is not limited to floor plans 112a of the building 62 where the fire detection system 20 is to be located, an address 112b of the building 62 where the fire detection system 20 is to be located, a number of occupants 112c of the building 62 where the fire detection system 20 is to be located, a typical building usage 112d of the building 62 where the fire detection system 20 is to be located, types of articles 112e within the building 62 where the fire detection system 20 is to be located, types of hazards 112f within the building 62 where the fire detection system 20 is to be located, evacuation points 112g within the building 62 where the fire detection system 20 is to be located, and current/proposed device locations 112h. It is understood that the input 110 are examples and there may be additional inputs 110 utilized in the systems 100, thus the embodiments of the present disclosure are not limited to the inputs 110 listed.

The floor plans 112a of the building 62 where the fire detection system 20 is to be located may include details about the floors 61 of the building 62, including, but not limited to, a number of floors 61 within the building 62, the layout of each floor 61 within the building 62, the number of rooms 64 on each floor 61 within the building 62, the height of each room 64, the organization/connectivity of each room 64 on each floor 61 within the building 62, the number of doors 80 within each room 64, the location of the doors 80 in each room 64, the number of windows 90 within each room 64, the location of the windows 90 within each room 64, the number of heating and ventilation vents within each room 64, the location of heating and ventilation vents within each room 64, the number of electrical outlets within each room 64, and the location of electrical outlets within each room 64. The address 112b of the building 62 where the fire detection system 20 is to be located may include, but is not limited to, a street address of the building 62, the geolocation of the building 62, the climate zone where the building 62 is located, and objects surrounding the building 62 (e.g., water, trees, mountains).

The number of occupants 112c of the building 62 where the fire detection system 20 is to be located may include, but is not limited to a number of occupants currently in the building 62 and details about the type of occupants (e.g., child, adult, elderly). Further the number of occupants 112c may be updated in real-time of may be a predication. The typical building usage 112d of the building 62 where the fire detection system 20 is to be located may include what the building 62 is being used for such as, for example, residential, lab space, manufacturing, machining, processing, office space, sports, schooling, etc. The types of articles 112e within the building 62 where the fire detection system 20 is to be located may include detail regarding objects within the building 62 and the known flammability of each object such as, for example, if the building 62 used to store furniture or paper, which is flammable. The types of hazards 112f within the building 62 where the fire detection system 20 is to be located may include a detailed list of hazards within the building 62 and where the hazards are located. For example, the types of hazards 112f may state that an accelerant (e.g., gasoline) is being stored in the work space on the second floor 61. In another example, types of hazards 112f may include that a room 64 is mainly used as office where the main components are electronics (e.g., electronics that are possible source of fire) and stationary elements (e.g., accelerants). The types of evacuation points 112g within the building 62 where the fire detection system 20 is to be located may include a detailed list of evacuations points 112g within the building 62 where an individual may exit the building 62. For example, the types of evacuation points may be windows 90 and doors 80.

The device locations 112h may be the current or proposed locations of fire detection devices 30, fire suppression devices 40, and fire escape devices 50. The design engine 130 may analyze the device locations 112h to determine the device location correctness 140d. For example, the design engine 130 may receive as input the actual state of the fire detection system 20 design (that can be manually input by the user) and may displays the forbidden/incorrect elements, and a recommendations for improvement, where the user case use it as a guidance or directly accept all the recommendations.

Building requirements 114 may include but are not limited to building system requirements 114a of the building 62 where the fire detection system 20 is to be located and a desired level of certification 114b for the building 62 where the fire detection system 20 is to be located. The building system requirements 114a may include but are not limited to the type of fire detection system required and/or desired for the building 62. The desired level of certification 114b may include laws, statutes, regulations, city certification requirements (e.g., local ordinances), state certification requirements (e.g., state laws and regulations), federal certification requirements (e.g., federal laws and regulations), association certification requirements, industry standard certification requirements, and/or trade association certification requirements (e.g., National Fire Protection Association).

The inputs 110 are provided to the design engine 130. The design engine 130 may be local, remote, and/or cloud based. The design engine 130 may be a software as a service. The design engine 130 may be a computing device including a processor and an associated memory comprising computer-executable instructions that, when executed by the processor, cause the processor to perform various operations. The processor may be, but is not limited to, a single-processor or multi-processor system of any of a wide array of possible architectures, including field programmable gate array (FPGA), central processing unit (CPU), application specific integrated circuits (ASIC), digital signal processor (DSP) or graphics processing unit (GPU) hardware arranged homogenously or heterogeneously. The memory may be but is not limited to a random access memory (RAM), read only memory (ROM), or other electronic, optical, magnetic or any other computer readable medium.

The design engine 130 is configured to analyze the inputs 110 to determine fire threat models 200, fire detection system device placement 300, a compliance check 400, and fire signage system 500 in response to the inputs 130. The design engine 130 may analyze the inputs 110 in an autonomous and/or semi-autonomous manner. For example, in a semi-autonomous manner, the design engine 130 may generate multiple different fire threat models 200, fire detection system device placements 300, compliance checks 400, and a fire signage system 500 for a human user (e.g., designer) to then review, adjust, and/or make a selection. In another example, in an autonomous manner, the design engine 130 may determine a single best option or multiple best options for fire threat models 200, fire detection system device placement 300, a compliance check 400, and a fire signage system 500 to then be presented to a human user.

The design engine 130 may organize the fire threat models 200, fire detection system device placements 300, compliance checks 400, and a fire signage system 500 into outputs 140. The outputs 140 may also include fire detection system device list 140a, a fire detection system device location list 140b for each component on the fire detection system device list 140a, fire detection system device specification 140c for each component on the fire detection system device list 140a, and a device location correctness 140d.

The system 10 may also include or be in communication with a fire detection system device databases 150. The fire detection system device databases 150 may include details and specifications of devices that may be utilized in a fire detection system 20. The fire detection system device databases 150 may be a single central repository that is updated either periodically or in real-time. The fire detection system device databases 150 may also link to outside databases in real-time, such as, for example online supplier databases of components for a fire detection system 20. The fire detection system device databases 150 may include a fire detection device database 150a, a fire suppression device database 150b, and a fire escape device database 150c.

The fire detection device database 150a may include information such as the types of fire detection devices 30 that may be utilized and performance characteristics of each fire detection devices 30. The fire detection device database 150a may also include specifications/datasheets for installation constraints as it can be preferred locations for placement, forbidden places, and/or recommended distances from possible fire sources or sources of false detection. For example, a smoke detectors may not be installed in bathrooms as it can trigger false alarms due the vapor, smoke detectors may be installed in a kitchen no close than 3 meters from the fire source (cook/oven) and not further away than 5 meters to avoid late detection, nor the device should be placed closer than 30 centimeters to the ceiling, or preferred placement should be closer to ceiling than to the floor. In another example, in the case of ceiling placement, a device should not be placed closer than X cm to the wall or any blockage object. Other information stored in the fire detection device database 150a may include if the device is battery powered or if the device requires an outlet/what kind of outlet/plug. The fire suppression device database 150b may include information such as the types of fire suppression devices 40 that may be utilized, performance characteristics of each fire suppression device 40, and the preferred installation location of the fire suppression devices 40. The performance characteristics of fire suppression device 40 may include the effectiveness of each fire suppression devices 40 against different types of fires (e.g., chemical fire, electrical fire, paper fire, etc.). For example, the preferred installation location for a portable extinguisher may be an easy accessible place, no further away than X cm to the possible ignition source. The fire escape database 150c may include information such as the types of fire escape devices 50, restrictions on placement of the fire escape devices 50

(e.g., a fire escape ladder shall be located proximate a window 90), and the performance characteristics of each fire escape device 50.

Figure 2:
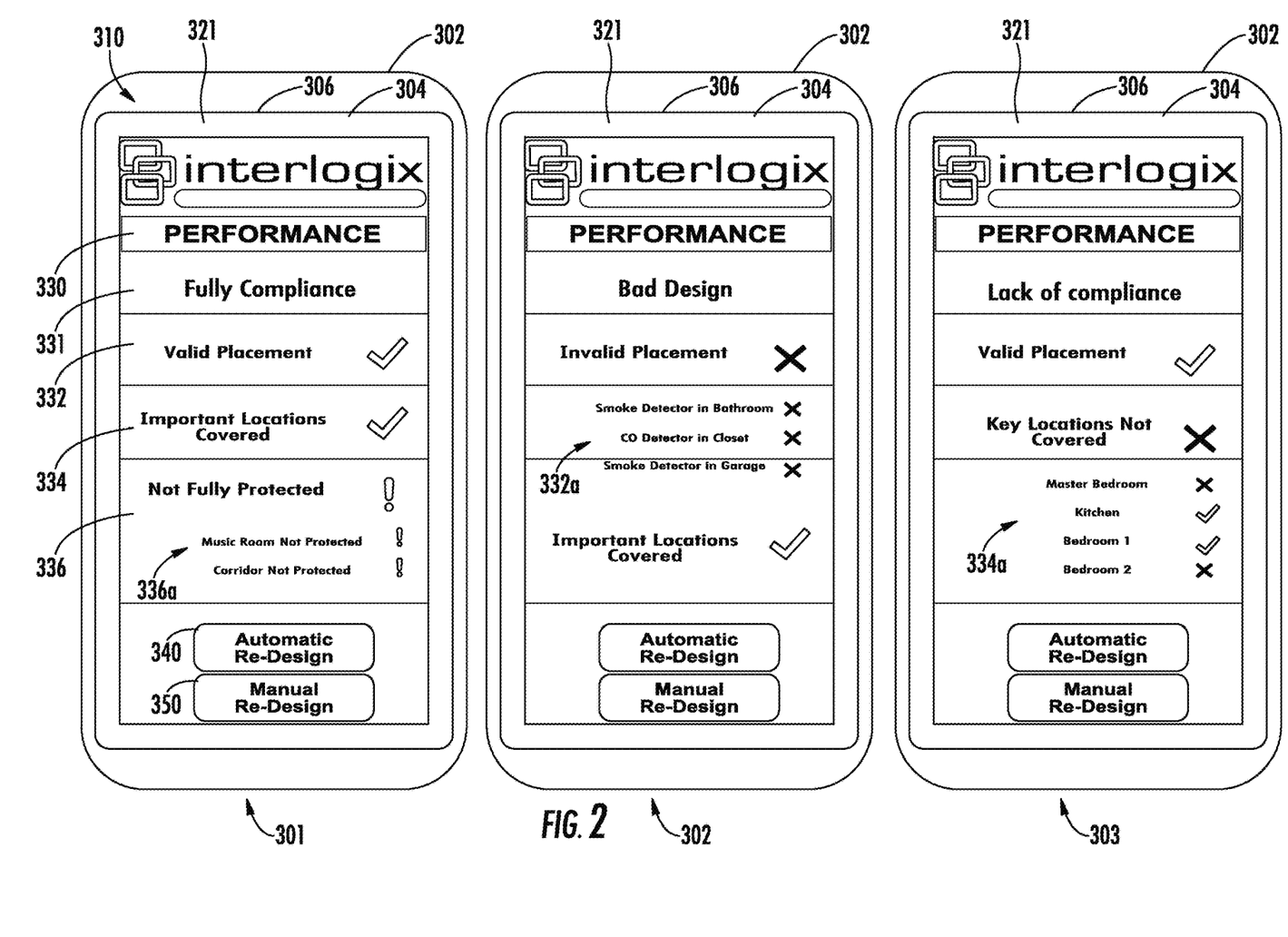
FIG. 2 is a schematic illustration of a fire detection system planning tool, in accordance with an embodiment of the disclosure.

Referring now to FIG. 2, with continued reference to FIG. 1, which shows a fire detection system planning tool 310 that that may be operable by a user through a computing device 302. The fire detection system planning tool 310 may be a software application associated with the design engine 130. For example, the fire detection system planning tool 310 may be a website or an application. The computing device 302 may be a desktop computer, laptop computer, smart phone, tablet computer, smart watch, or any other computing device known to one of skill in the art. In the example shown in FIG. 2, the computing device 302 is a tablet computer. The computing device 302 may include a display screen 304 and an input device 306, such as, example, a mouse, a touch screen, a scroll wheel, a scroll ball, a stylus pen, a microphone, a camera, etc. In the example shown in FIG. 2, since the computing device 302 is a tablet computer, then the display screen 304 may also function as an input device 306.

The fire detection system planning tool 310 is configured to aid a designer/user through a process of designing a fire detection system 20 by providing real-time feedback during the design process. As shown in FIG. 2, the fire detection system planning tool 310 may design the fire detection system 20 in an autonomous and/or semi-autonomous manner through the design engine 130. A user may utilize the fire detection system planning tool 310 to enter the inputs 110 into the system 100, then once the fire detection system 20 is designed, the fire detection system planning tool 310 may generate a performance report 330 from which a user may evaluate the designs of the fire detection systems 20. The performance report 330 may evaluate the overall design of the fire detection system 20 and issue an analysis of the designs at 331, such as, for example, "Fully Compliant" at 301 (e.g., fully compliant with all constraints), "Bad Design" at 302, or "Lack of Compliance" at 303 (e.g., not fully compliant with all constraints). The performance report 330 may evaluate various aspects of the design of the fire detection system 20.

The performance report 330 may evaluate the placement 332 of each of the fire detection devices 30, fire suppression devices 40, and the fire escape devices 50. The performance report 330 may indicate a validation of the placement 332 of at least one of the fire detection devices 30, the fire suppression devices 40, and the fire escape devices 50. A valid placement would mean that the fire detection devices 30, the fire suppression devices 40, and the fire escape devices 50 do not violate a criteria such as, for example, the building requirements 114. An invalid placement would mean that at least one of the fire detection devices 30, the fire suppression devices 40, and the fire escape devices 50 does violate a criteria such as, for example, the building requirements 114. The placement validation 332 may also include an explanation 332a for an invalid placement, such as, for example, "a smoke detector in the bathroom", a CO detector in the closet", or "a smoke detector in the garage". The performance report 330 may indicate a validation of the placement 332 that depicts whether or not the placement is a legal placement.

The performance report 330 may evaluate possible important locations 334 for each of the fire detection devices 30, fire suppression devices 40, and the fire escape devices 50. The important locations 334 may be mandated by law. The performance report 330 may indicate whether important locations 334 are protected for at least one of the fire detection devices 30, the fire suppression devices 40, and the fire escape devices 50. The performance report 330 may indicate that all important locations 334 for the fire detection devices 30, the fire suppression devices 40, and the fire escape devices 50 are covered, as shown at 301 and 302. The performance report 330 may indicate that not all important locations 334 for the fire detection devices 30, the fire suppression devices 40, and the fire escape devices 50 are covered, as shown at 303. The performance report 330 may also include a summary 334a of the important locations 334, as shown in FIG. 2.

The performance report 330 may evaluate possible locations 336 for each of the fire detection devices 30, fire suppression devices 40, and the fire escape devices 50. The performance report 330 may indicate whether locations 336 of at least one of the fire detection devices 30, the fire suppression devices 40, and the fire escape devices 50 are covered. The performance report 330 may indicate that all locations 336 for the fire detection devices 30, the fire suppression devices 40, and the fire escape devices 50 are covered, as shown at 301 and 302. The performance report 330 may indicate that not all locations 336 for the fire detection devices 30, the fire suppression devices 40, and the fire escape devices 50 are covered, as shown at 303. The performance report 330 may also include a summary 336a of the locations 336, as shown in FIG. 2.

The performance report 330 may also provide the user options to either automatically re-design the fire detection system 20 at 340 or manually re-design the fire detection system 20 at 350. Once the fire detection system 20 is redesigned, then the performance report 330 will run again to re-evaluate the fire detection system 20.

Figure 3:
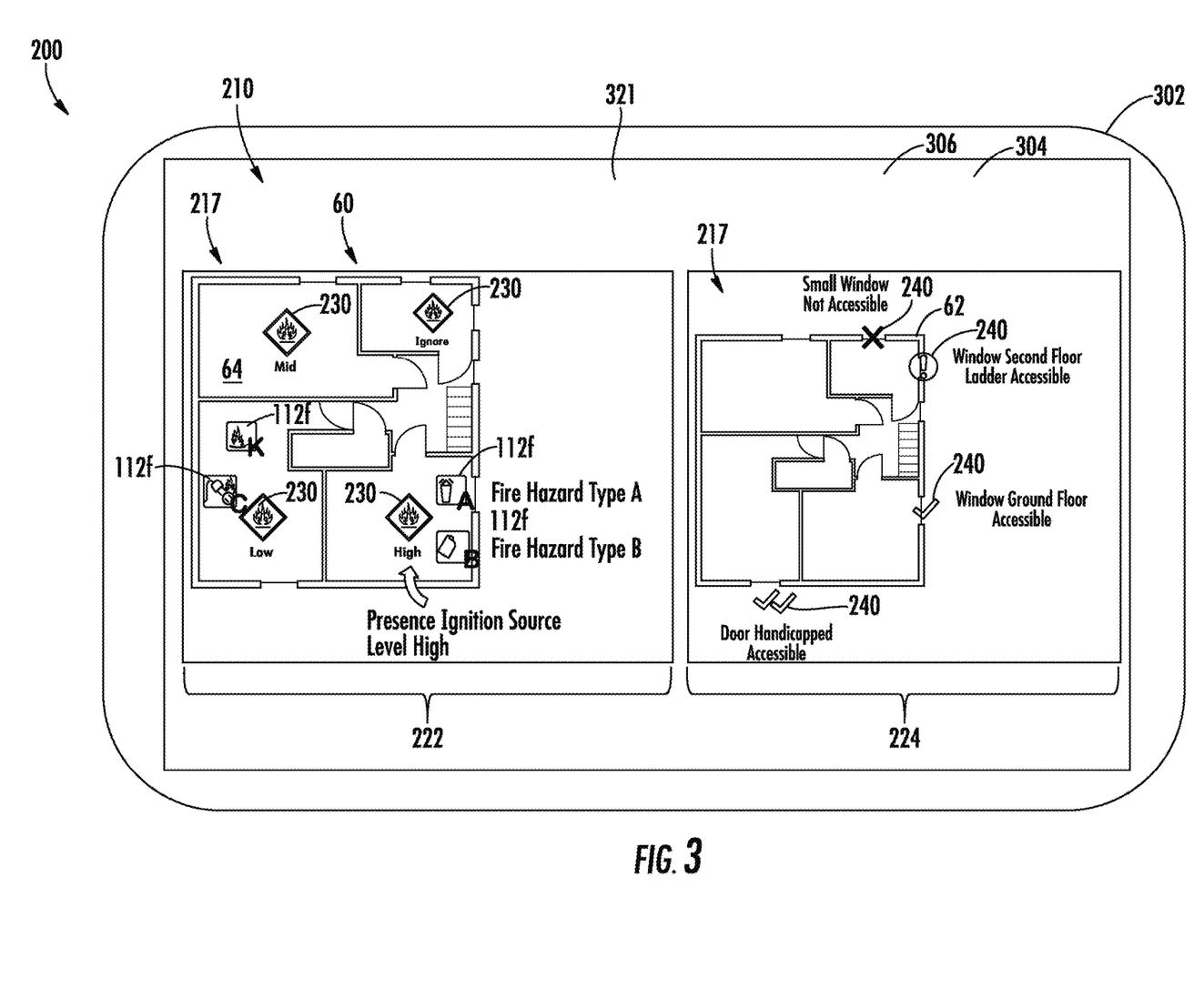
FIG. 3 is a schematic illustration of a fire threat modeling tool, in accordance with an embodiment of the disclosure.

Referring now to FIG. 3, with continued reference to FIGS. 1-2, which shows the fire threat models 200 of FIG. 1. FIG. 3 illustrates a fire threat modeling tool 210 that may be operable by a user through a computing device 302. The fire threat modeling tool 210 may be a software application associated with the design engine 130. For example, the fire threat modeling tool 210 may be a website or an application. The computing device 302 may be a desktop computer, laptop computer, smart phone, tablet computer, smart watch, or any other computing device known to one of skill in the art. In the example shown in FIG. 3, the computing device 302 is a tablet computer. The computing device 302 may include a display screen 304 and an input device 306, such as, example, a mouse, a touch screen, a scroll wheel, a scroll ball, a stylus pen, a microphone, a camera, etc. In the example shown in FIG. 3, since the computing device 302 is a tablet computer, then the display screen 304 may also function as an input device 306.

The fire threat modeling tool 210 is configured to aid a designer/user through a process of evaluating the fire threat within each room 64 of a building 62 by providing real-time feedback during the design process. The fire threat modeling tool 210 utilizes the inputs 110 of FIG. 1 to construct a map 60 depicting a detailed dynamic fire threat input map 117. For example, the fire threat modeling tool 210 may take in the inputs 110 for a floor plan 112a where the door 80, windows 90, rooms 64, and other features such as articles 112e (e.g., furniture and appliances) are identified (and possibly labeled) and produces a detailed dynamic fire threat map 220. The dynamic fire threat input map 117 may be constructed at two different inputs including a fire source input 222 and a fire evacuation point input 224. The dynamic fire threat input map 117 may also be constructed for an entire building 62 and not just a single floor 61.

For the fire source input 222, the detailed dynamic fire threat input map 117 is described in a single room 64 or zone. Factors such as room geometry, location of articles 112e (e.g., obstacles/furniture), location of evacuation points 112g (e.g., exterior windows and doors), types of evacuation points 112f, fire hazards 112f present in the room 64, and a probability 230 of a fire may be incorporated. The probability 230 of a fire may be statistically determined in response to the inputs 110 present in the room 64 and/or historical data. A statistical approach may be used to identify the probability 230 of a fire in a room 64 and the probability 230 may be displayed on the dynamic fire threat input map 117, as shown in FIG. 3. The probability 230 may display on the dynamic fire threat input map 117 as a high probability, a low probability, a mid-probability, or ignore, as shown in FIG. 3. The dynamic fire threat input map 117 may be updated in real-time as new inputs 110 and/or data from the fire detection system device database 150 is received. The dynamic fire threat input map 117 may also display all the hazards 112f and where the hazards 112f are located in each room 64, as shown in FIG. 3

For the fire evacuation point input 224, a dynamic fire escape options and fire propagation model is constructed from the knowledge of connectivity between rooms 64 and available fire escape devices 50. The proximity of the rooms 64 are used to determine the likelihood of fire spreading to neighboring rooms 64. For example, a high probability 230 of fire in one room 64 may raise the probability 230 of a fire in adjacent rooms 64. The doors 80 and windows 90 on the exterior of the building 62 are treated as possible evacuation points 112g in case of fire and may be weighted according to their relative accessibility 240. For example a window 90 located on a second floor may not be accessible unless a fire escape devices 50 is located nearby, such as, for example, a ladder. The process of obtaining the accessibility 240 of each evacuation point 112g may be automatically determined based on the type of evacuation point 112g, the location of the evacuations point 112g, and of any fire escape devices 50 are required to be located proximate the evacuation point 112g. The accessibility 240 of each evacuation point 112g may be displayed on the second level 224 of the dynamic fire threat input map 117, as shown in FIG. 3. The accessibility 240 may also be displayed on the dynamic fire threat input map 117 using wording and/or symbols. For example, a double green check mark may mean that the evacuation point 112g is handicap accessible, a single green checkmark may mean that the evacuation point 112g is ground floor accessible, a red "X" may mean that the evacuation point 112g is not accessible, and a yellow exclamation point may mean that the evacuation point 112g is accessible using a fire escape device 50. The fire threat modeling tool 210 may also factor into account the distance to each evacuation point 112g, when determining accessibility 240.

Figure 4:
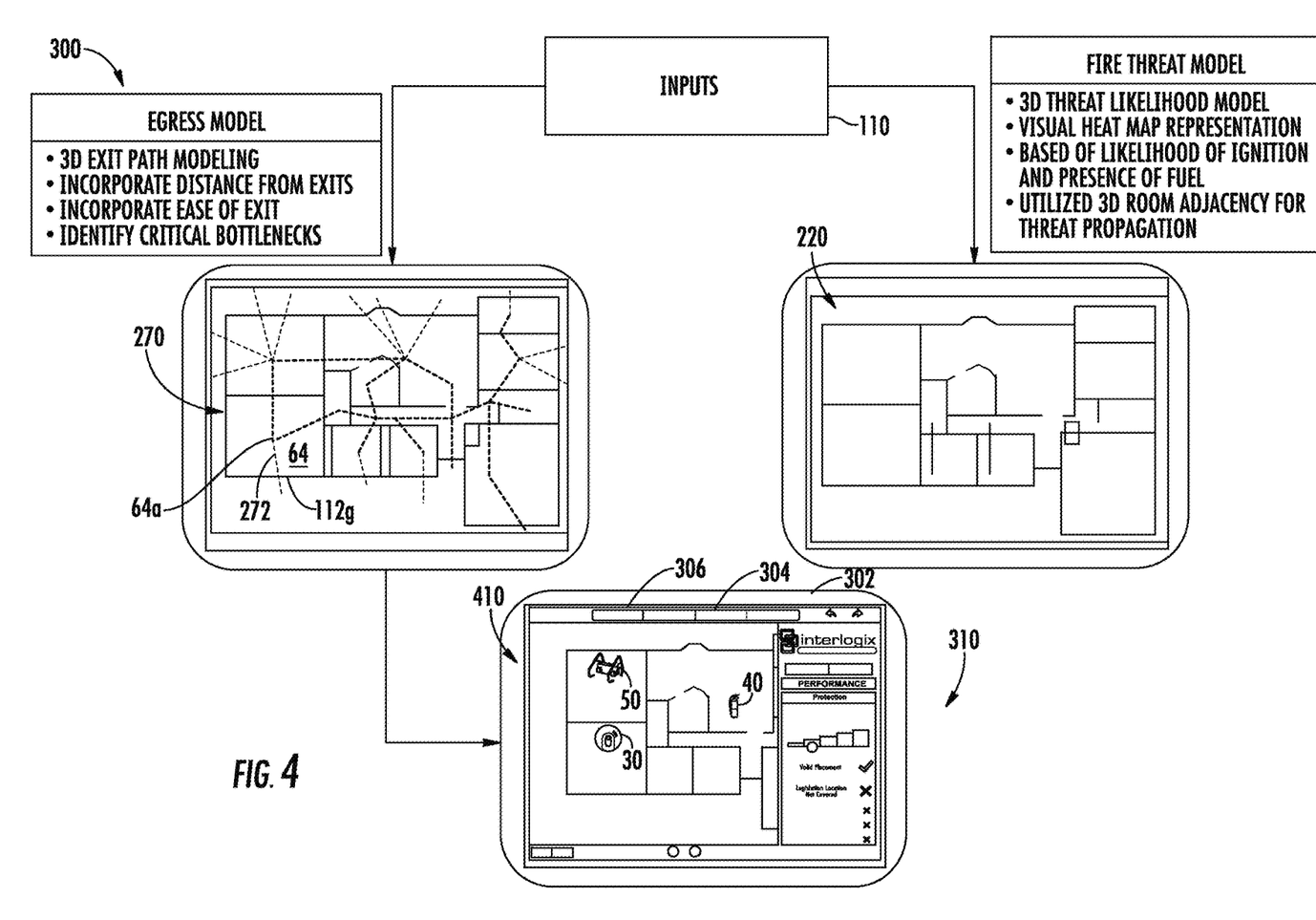
FIG. 4 is a schematic illustration of a fire detection system device placement tool, in accordance with an embodiment of the disclosure.
Figure 5:
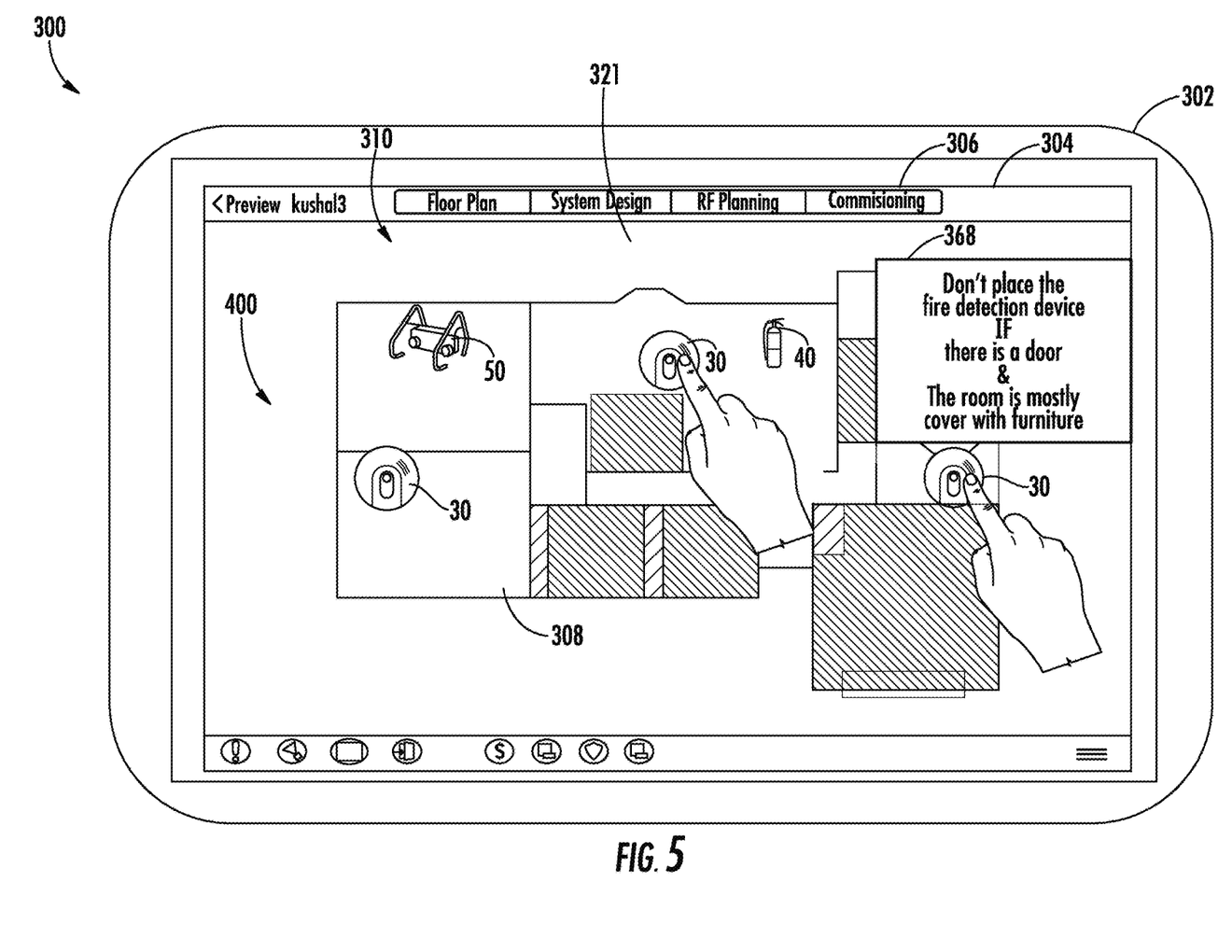
FIG. 5 is a schematic illustration of a fire detection system device placement tool, in accordance with an embodiment of the disclosure.

Referring now to FIGS. 4-5, with continued reference to FIGS. 1-3, which shows the fire detection system device placement 300 of FIG. 1. FIG. 4 illustrates a fire detection system device placement tool 410 that may be operable by a user through a computing device 302. The fire detection system device placement tool 410 may be a software application associated with the design engine 130. The computing device 302 may be a desktop computer, laptop computer, smart phone, tablet computer, smart watch, or any other computing device known to one of skill in the art. In the example shown in FIG. 4, the computing device 302 is a tablet computer. The computing device 302 may include a display screen 304 and an input device 306, such as, example, a mouse, a touch screen, a scroll wheel, a scroll ball, a stylus pen, a microphone, a camera, etc. In the example shown in FIG. 4, since the computing device 302 is a tablet computer, then the display screen 304 may also function as an input device 306.

The fire detection system device placement tool 410 is configured to aid a designer/user through a process of fire detection system device placement 300 by providing real-time feedback during the design process. As shown in FIG. 4, the fire detection system device placement tool 410 automatically determines the number and location of fire detection devices 30, fire suppression devices 40, and fire escape devices 50 in response to the inputs 110. The fire detection system device placement tool 410 is configured to determine a dynamic fire threat map 220 and an egress map 270. The dynamic fire threat map 220 may be a detailed map 60 generated from the fire threat input map 117 shown in FIG. 3. The dynamic fire threat map 220 may use color shading to depict the probability 230 of a fire. The egress map 270 depicts an approximate location of evacuation points 112g and the distance 272 to each evacuation point 112g. The distance 272 may be measured from or relative to a center point 64a within each room 64. The egress map 270 may incorporate ease of each evacuation points 112g (e.g., accessibility 240) and also identify critical bottlenecks that might inhibit egress during an emergency (e.g., a fire).

The fire detection system device placement tool 410 may utilize the dynamic fire threat map 220 and the egress map 270 to automatically place fire detection devices 30, fire suppression device 40, and fire escape devices 50 throughout rooms 64 on a map 308, which is displayed on the display screen 304. The fire detection system device placement tool 410 may further optimize or adjust the number and locations of fire detection devices 30, fire suppression device 40, and fire escape devices 50 in response to a desired budget of a customer and/or a desired level of safety.

As shown in FIG. 5, the map 308 is interactive in real-time and a user will be able to move the fire detection devices 30, fire suppression devices 40, and fire escape devices 50 throughout rooms 64 on the map 308 by interacting the map 308, such as for example, by "drag and drop" or by touch. The fire detection system device placement tool 410 is configured to activate an alert 368 if movement of the fire detection devices 30, fire suppression device 40, and/or the fire escape devices 50 violates a constraint such as for example a building requirements 114 device constraint. The devices constraints may include any constraint to ensure proper and/or efficient operation of the fire detection devices 30, fire suppression device 40, and fire escape devices 50. For example, it may not be most effective to place a fire detection device 30 in a bathroom or a fire escape device 50 (e.g., a ladder) may need to be located proximate a window 90. The constraints may also include specifications/datasheets for installation constraints as it can be preferred locations for placement, forbidden places, and/or recommended distances from possible fire sources or sources of false detection. For example, a smoke detectors may not be installed in bathrooms as it can trigger false alarms due the vapor, smoke detectors may be installed in a kitchen no close than 3 meters from the fire source (cook/oven) and not further away than 5 meters to avoid late detection, nor the device should be placed closer than 30 centimeters to the ceiling, or preferred placement should be closer to ceiling than to the floor. In another example, in the case of ceiling placement, a device should not be placed closer than X cm to the wall or any blockage object. Other information stored in the fire detection device database 150a may include if the device is battery powered or if the device requires an outlet/what kind of outlet/plug.

As mentioned above, the building requirements 114 may include building system requirements 114a and a desired level of certification 114b. The desired level of certification 114b may also include legislative constraints. In an embodiment, the fire detection system device placement tool 410 is configured to check in real-time to ensure that the fire detection devices 30, fire suppression device 40, and fire escape devices 50 do not violate a legislative constraint. Advantageously, the map 60 in the fire detection system device placement tool 410 serves as a visualization aid that informs the user (i.e., designer) in real-time of the specific constraints and whether the constraints are violated during modification by the user.

Figure 6:
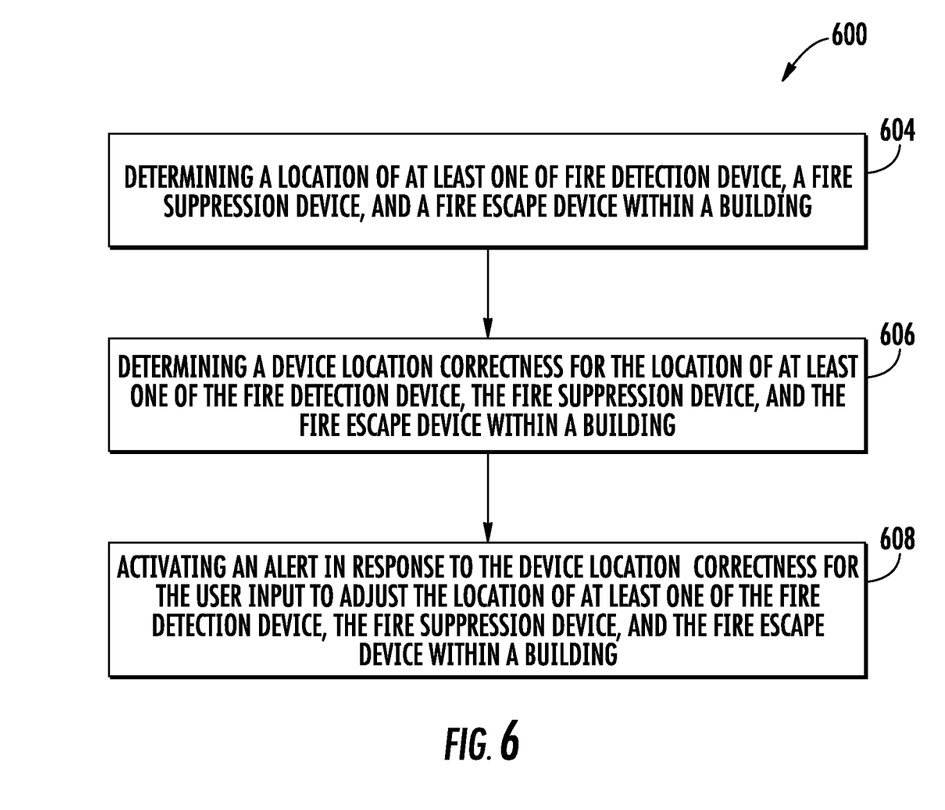
FIG. 6 is a flow diagram illustrating a method of designing a fire detection system, in accordance with an embodiment of the disclosure.

Referring now also to FIG. 6 with continued reference to FIGS. 1-5. FIG. 6 shows a flow diagram illustrating a method 600 of designing a fire detection system 200 through user-manual placement with violation verification. At block 604, a location of at least one of fire detection device 30, a fire suppression device 40, and a fire escape device 50 is determined. The locations may be determined by: determining a probability 230 of a fire in a room 64; determining a number of fire detection devices 30 for a fire detection system 20 within the room 64 in response to the probability 230 of the fire in the room 64; determining a number of fire suppression devices 40 for the fire detection system 20 within the room 64 in response to the probability 230 of a fire in the room 64; and determining a location of each of the fire detection devices 30 within the room 64 and a location of the fire suppression devices 40 within the room 64

The probability 230 of a fire in a room 64 may be determined by: determining a geometry of a room 64 in response to a floor plan 112a; determining whether one or more articles 112e are located within the room 64 and a flammability of each of the one or more articles 112e; determining whether one or more hazards 112f are located within the room 64; and determining a probability 230 of a fire in the room in response to at least one or more articles 112e are located within the room, the flammability of each of the one or more articles 112e, and the one or more hazards 112f are located within the room 64. Also avoiding obstacles and having into account the field of view of such devices At block 606, a device location correctness 140d is determined for the location of at least one of fire detection device 30, a fire suppression device 40, and a fire escape device 50 within a building 62.

At block 608, an alert 368 is activated in response to the device location correctness 140d for the location of at least one of fire detection device 30, a fire suppression device 40, and a fire escape device 50 within a building 62. A user input to adjust the location of at least one of the fire detection device 30, the fire suppression device 40, and the fire escape device 50 within a building 62 and the user input may prompt a re-check of the device location correctness 140d.

While the above description has described the flow process of FIG. 6 in a particular order, it should be appreciated that unless otherwise specifically required in the attached claims that the ordering of the steps may be varied.

Figure 7:
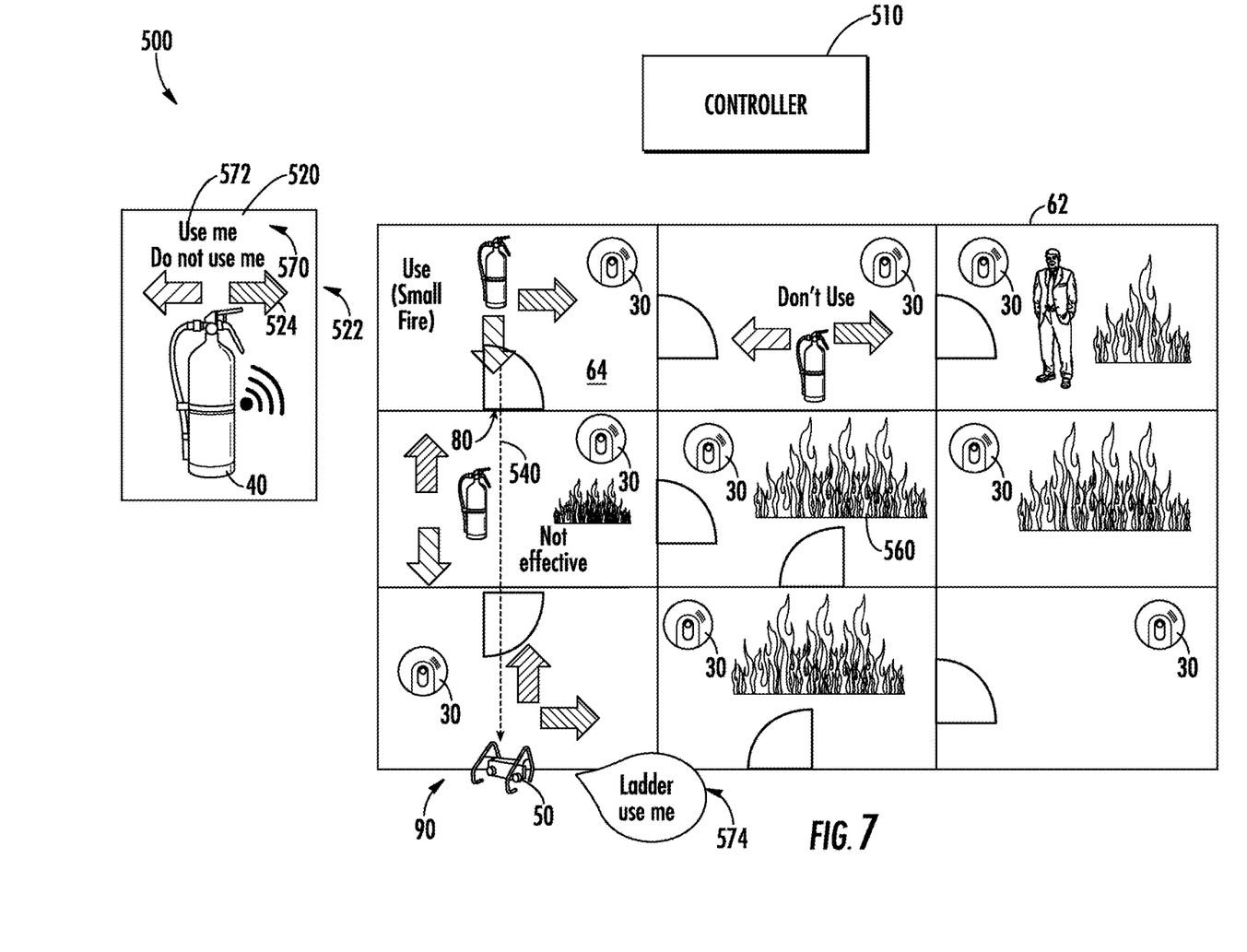
FIG. 7 is a schematic illustration of a fire signage system, in accordance with an embodiment of the disclosure.

Referring now to FIG. 7, with continued reference to FIGS. 1-6, which shows a fire signage system 500 for use with the fire detection system 20 of FIG. 1. The fire signage system 500 may include one or more egress signs 520 located proximate a fire suppression device 40 or a fire escape device 50. The fire signage system 500 may be in communication with each of the fire detection devices 30 of the fire detection system 20 and each of the egress signs 520.

The fire detection system 20 may include a controller 510 to coordinate the operation of the fire detection devices 30 and the egress signs 520.

The controller 510 may be a computing device including a processor and an associated memory comprising computer-executable instructions that, when executed by the processor, cause the processor to perform various operations. The processor may be, but is not limited to, a single-processor or multi-processor system of any of a wide array of possible architectures, including field programmable gate array (FPGA), central processing unit (CPU), application specific integrated circuits (ASIC), digital signal processor (DSP) or graphics processing unit (GPU) hardware arranged homogenously or heterogeneously. The memory may be but is not limited to a random access memory (RAM), read only memory (ROM), or other electronic, optical, magnetic or any other computer readable medium.

The controller 510 may obtain a location of each of the fire detection devices 30 from the system 100 (e.g., the design engine 130), such that, when a specific fire detection device 30 detects a fire 560 then the controller 510 may determine where the fire 560 is located in depending upon where the fire detection device 30 is located. The controller 510 may also obtain a location within the building 62 of each of the egress signs 520. When a fire 560 is detected by at least one of the fire detection devices 30 then the controller may determine a safe evacuation route 540 out of the building 62 and then communicate with the egress signs 520 to direct the individual along the safe evacuation route 540 out of the building 62. The controller 510 and the egress signs 520 are updated in real-time, as the fire 560 changes, moves, and/or spreads.

The egress signs 520 may provide instructions 520 to direct the individuals along the safe evacuation route 540 out of the building 62. The instructions 522 may be verbal and/or visual. In the example shown in FIG. 7, the instructions 522 may be visually displayed to the user as words and symbols, such as the arrow 524 directing the individual to follow the path from one room 64 to another or to not follow a path. The arrows 524 may light up green to induce the individual to follow the safe evacuation route 540 or the arrows 524 may light up red to warn the individual to not go towards a fire 560 or unsafe route. As mentioned above, the instructions 522 may also be verbal to provide the individual audible instructions that direct the individual along the safe evacuation route 540.

The egress signs 520 may be located proximate fire suppression devices 40 and/or fire escape devices 50 provide instructions 570 to direct the individual whether or not to make us of the fire suppression devices 40 and/or fire escape devices 50 located proximate the egress signs 520. The fire signage system 500 is configured to determine a size and/or type of the fire 560 from the fire detection devices 30 and then determine whether or not each fire suppression device 40 would be effective against a fire 560 of the determined size and/or type. The controller 510 may obtain a type of each of the fire suppression devices 40 from the system 100 (e.g., the design engine 130) and then may determine whether the type of the fire suppression device is effective against the determined size and/or type of fire 560. For example, some fire suppression devices 40 may not be large enough to fight a fire 560 of a determined size. In another example, some fire suppression devices 40 may simply lack the appropriate suppression agent to fight a fire 560 of a determined type. If the fire suppressions device 40 may be effective against a fire 560 of the determined size and/or type, then the instructions 570 may instruct the individual to use the fire suppression device 40. If the fire suppressions device 40 may not be effective against a fire 560 of the determined size and/or type, then the instructions 570 may instruct the individual to not use the fire suppression device 40.

The instructions 570 may be verbal and/or visual. In the example shown in FIG. 7, the instructions 570 may be visually displayed to the user as written instructions 572 directing the individual to take or not take the fire suppression device 40 to use for fighting the fire 560. The written instructions 572 may light up green or red to induce the individual to follow the instructions 570. As mentioned above, the instructions 570 may also be verbal to provide the individual audible instructions that direct the individual to use the fire suppression devices 40 and/or fire escape devices 50. For example, an egress signs 520 may be located proximate a fire escape device 50 to provide audible instructions to the individuals to use the fire escape device 50, as shown in FIG. 7 at 574.

Figure 8:
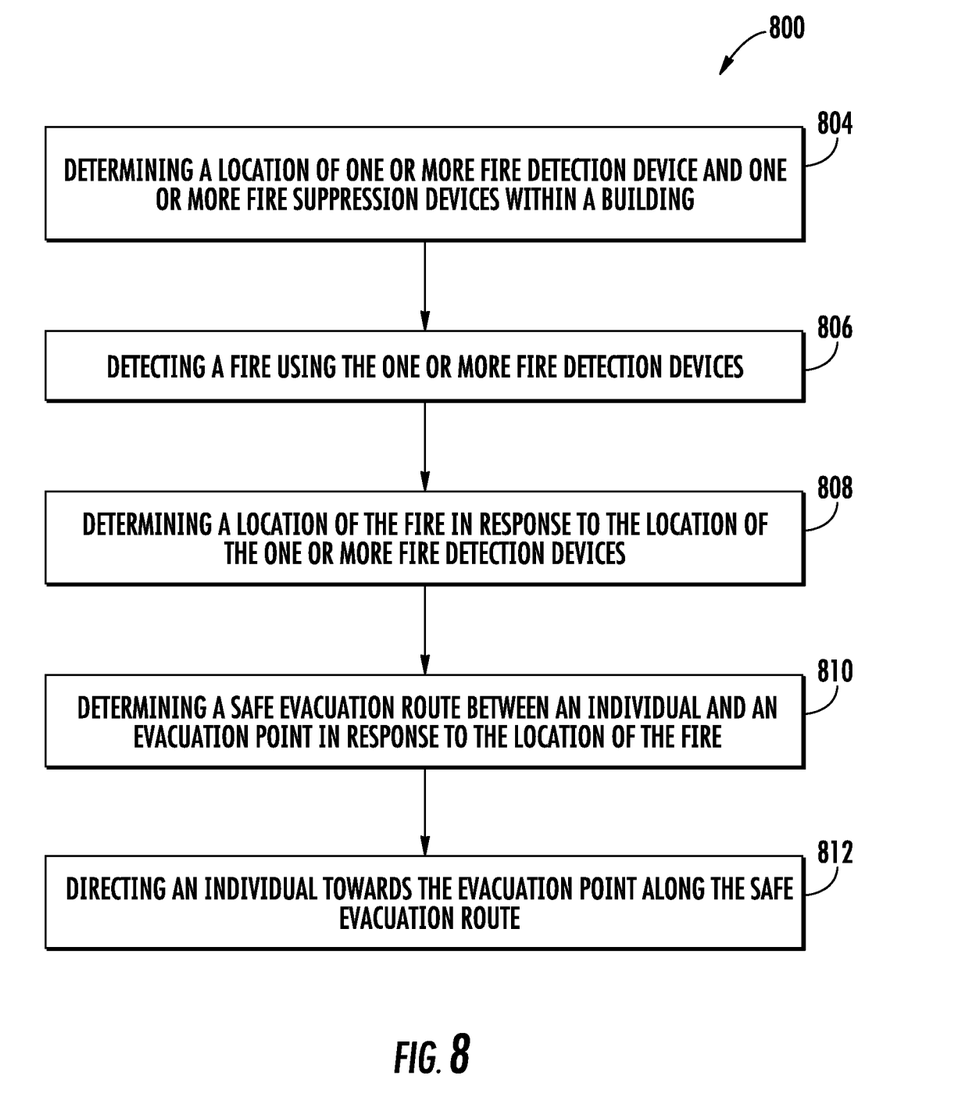
FIG. 8 is a flow diagram illustrating a method of directing individuals towards an evacuation point during a fire, in accordance with an embodiment of the disclosure.

Referring now also to FIG. 8 with continued reference to FIGS. 1-7. FIG. 8 shows a flow diagram illustrating a method 800 of directing individuals to an evacuation point 112g during a fire 560, according to an embodiment of the present disclosure. At block 804, a location of one or more fire detection device 30 and one or more fire suppression devices 40 is determined. At block 806, a fire 560 within the building 62 is detected using the one or more fire detection devices 30. At block 808, a location of the fire 560 within the building is determined in response to the location of the one or more fire detection devices 30. At block 810, a safe evacuation route 540 between an individual and an evacuation point 112g is determined in response to the location of the fire 560 within the building 62. At block 812, an individual is directed towards the evacuation point 112g along the safe evacuation route 540.

The individual may be directed by activating an egress sign 520 along the safe evacuation route 540. As mentioned above, the egress sign 520 is configured to provide instructions 522 to direct an individual towards the evacuation point 112g along the safe evacuation route 540.

The method 800 may further comprise: determining a size and/or type of the fire 560 within the building 62; detecting a type of each of the one or more fire suppression devices 40 within the building 62; and determining whether each of the one or more fire suppression devices 40 within the building 62 can be used to fight the fire 560 in response to the size and/or type of the fire 560 and the type of each of the one or more fire suppression devices 40. The individual may then be instructed whether one of the one or more fire suppression device 40 can be used to fight the fire 560. The individual may be instructed by activating an egress sign 520 along the safe evacuation route 540. The egress sign 520 is configured to provide instructions 570 that one of the one or more fire suppression device 40 can or cannot be used to fight the fire 560.

While the above description has described the flow process of FIG. 8 in a particular order, it should be appreciated that unless otherwise specifically required in the attached claims that the ordering of the steps may be varied.

As described above, embodiments can be in the form of processor-implemented processes and devices for practicing those processes, such as a processor. Embodiments can also be in the form of computer program code containing instructions embodied in tangible media, such as network cloud storage, SD cards, flash drives, floppy diskettes, CD ROMs, hard drives, or any other computer-readable storage medium, wherein, when the computer program code is loaded into and executed by a computer, the computer becomes a device for practicing the embodiments. Embodiments can also be in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into an executed by a computer, the computer becomes a device for practicing the embodiments. When implemented on a general-purpose microprocessor, the computer program code segments configure the microprocessor to create specific logic circuits.

The term "about" is intended to include the degree of error associated with measurement of the particular quantity based upon the equipment available at the time of filing the application. For example, "about" can include a range of ±8% or 5%, or 2% of a given value.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:
1. A method of designing a fire detection system, the method comprising:
determining a location of one or more fire detection devices within the building;
generating a map that displays the location of one or more fire detection device;
determining at least one of a location of one or more fire suppression devices and a location of one or more fire escape devices of a fire detection system within the building;
generating a map on a computing device that displays the location of one or more fire detection device and at least one of the location of one or more fire suppression devices and the location of one or more fire escape devices;
determining whether a constraint is violated by at least one of the location of one or more fire detection device, the location of one or more fire suppression devices, and the location of one or more fire escape devices; and
activating an alert when a constraint is violated by at least one of the location of one or more fire detection device, the location of one or more fire suppression devices, and the location of one or more fire escape devices.

2. A method of designing a fire detection system, the method comprising:
  determining a location of one or more fire detection devices within the building;
  generating a map that displays the location of one or more fire detection device;
  determining at least one of a location of one or more fire suppression devices and a location of one or more fire escape devices of a fire detection system within the building;
  generating a map on a computing device that displays the location of one or more fire detection device and at least one of the location of one or more fire suppression devices and the location of one or more fire escape devices; and
  receiving an input from a user that adjusts at least one of the location of one or more fire detection device, the location of one or more fire suppression devices, and the location of one or more fire escape devices.

3. The method of claim 2, wherein after receiving an input from a user, the method further comprises:
  determining whether a constraint is violated by the input from the user that adjusts at least one of the location of one or more fire detection device, the location of one or more fire suppression devices, and the location of one or more fire escape devices; and
  activating an alert when a constraint is violated by the input from the user that adjusts at least one of the location of one or more fire detection device, the location of one or more fire suppression devices, and the location of one or more fire escape devices.

4. A method of designing a fire detection system, the method comprising:
  determining a location of one or more fire detection devices within the building; and
  generating a map that displays the location of one or more fire detection device,
  wherein determining a location of one or more fire detection devices, a location of one or more fire suppression devices, and a location of one or more fire escape devices of a fire detection system within the building further comprises:
  determining a probability of a fire in each room of the building;
  determining a number of fire detection devices for the fire detection system within the room in response to the probability of the fire in each room;
  determining a number of fire suppression devices for the fire detection system within the room in response to the probability of a fire in each room; and
  determining a location of each of the fire detection devices within the room and a location of the fire suppression devices within each room.

5. The method of claim 4, wherein determining a probability of a fire in each room of the building further comprises:
  determining a geometry of each room in response to a floor plan;
  determining whether one or more articles are located within each room and a flammability of each of the one or more articles;
  determining whether one or more hazards are located within each room; and
  determining a probability of a fire in each room in response to at least one or more articles are located within each room, the flammability of each of the one or more articles, and the one or more hazards are located within each room.

6. A system for designing a fire detection system, the system comprising:
  a processor; and
  a memory comprising computer-executable instructions that, when executed by the processor, cause the processor to perform operations, the operations comprising:
  determining a location of one or more fire detection devices within the building;
  generating a map that displays the location of one or more fire detection device;
  determining whether a constraint is violated by at least one of the location of one or more fire detection device, the location of one or more fire suppression devices, and the location of one or more fire escape devices; and
  activating an alert when a constraint is violated by at least one of the location of one or more fire detection device, the location of one or more fire suppression devices, and the location of one or more fire escape devices.

7. A system for designing a fire detection system, the system comprising:
  a processor; and
  a memory comprising computer-executable instructions that, when executed by the processor, cause the processor to perform operations, the operations comprising:
  determining a location of one or more fire detection devices within the building;
  generating a map that displays the location of one or more fire detection device,
  determining at least one of a location of one or more fire suppression devices and a location of one or more fire escape devices of a fire detection system within the building;
  generating a map on a computing device that displays the location of one or more fire detection device and at least one of the location of one or more fire suppression devices and the location of one or more fire escape devices; and
  receiving an input from a user that adjusts at least one of the location of one or more fire detection device, the location of one or more fire suppression devices, and the location of one or more fire escape devices.

8. A system for designing a fire detection system, the system comprising:
  a processor; and
  a memory comprising computer-executable instructions that, when executed by the processor, cause the processor to perform operations, the operations comprising:
  determining a location of one or more fire detection devices within the building; and
  generating a map that displays the location of one or more fire detection device,
  wherein after receiving an input from a user, the operations further comprise:
  determining whether a constraint is violated by the input from the user that adjusts at least one of the location of one or more fire detection device, the location of one or more fire suppression devices, and the location of one or more fire escape devices; and
  activating an alert when a constraint is violated by the input from the user that adjusts at least one of the location of one or more fire detection device, the location of one or more fire suppression devices, and the location of one or more fire escape devices.

9. A system for designing a fire detection system, the system comprising:
a processor; and
a memory comprising computer-executable instructions that, when executed by the processor, cause the processor to perform operations, the operations comprising:
determining a location of one or more fire detection devices within the building; and
generating a map that displays the location of one or more fire detection device,
wherein determining a location of one or more fire detection devices, a location of one or more fire suppression devices, and a location of one or more fire escape devices of a fire detection system within the building further comprises:
determining a probability of a fire in each room of the building;
determining a number of fire detection devices for the fire detection system within the room in response to the probability of the fire in each room;
determining a number of fire suppression devices for the fire detection system within the room in response to the probability of a fire in each room; and
determining a location of each of the fire detection devices within the room and a location of the fire suppression devices within each room.

10. The system of claim 9, wherein determining a probability of a fire in each room of the building further comprises:
determining a geometry of each room in response to a floor plan;
determining whether one or more articles are located within each room and a flammability of each of the one or more articles;
determining whether one or more hazards are located within each room; and
determining a probability of a fire in each room in response to at least one or more articles are located within each room, the flammability of each of the one or more articles, and the one or more hazards are located within each room.

11. A computer program product tangibly embodied on a computer readable medium, the computer program product including instructions that, when executed by a processor, cause the processor to perform operations comprising:
determining a location of one or more fire detection devices within the building; and
generating a map that displays the location of one or more fire detection device;
determining whether a constraint is violated by at least one of the location of one or more fire detection device, the location of one or more fire suppression devices, and the location of one or more fire escape devices; and
activating an alert when a constraint is violated by at least one of the location of one or more fire detection device, the location of one or more fire suppression devices, and the location of one or more fire escape devices.

12. A computer program product tangibly embodied on a computer readable medium, the computer program product including instructions that, when executed by a processor, cause the processor to perform operations comprising:
determining a location of one or more fire detection devices within the building;
generating a map that displays the location of one or more fire detection device;
determining at least one of a location of one or more fire suppression devices and a location of one or more fire escape devices of a fire detection system within the building;
generating a map on a computing device that displays the location of one or
more fire detection device and at least one of the location of one or more fire suppression devices and the location of one or more fire escape devices; and
receiving an input from a user that adjusts at least one of the location of one or more fire detection device, the location of one or more fire suppression devices, and the location of one or more fire escape devices.

13. A computer program product tangibly embodied on a computer readable medium, the computer program product including instructions that, when executed by a processor, cause the processor to perform operations comprising:
determining a location of one or more fire detection devices within the building; and
generating a map that displays the location of one or more fire detection device,
wherein after receiving an input from a user, the operations further comprise:
determining whether a constraint is violated by the input from the user that adjusts at least one of the location of one or more fire detection device, the location of one or more fire suppression devices, and the location of one or more fire escape devices; and
activating an alert when a constraint is violated by the input from the user that adjusts at least one of the location of one or more fire detection device, the location of one or more fire suppression devices, and the location of one or more fire escape devices.

14. A computer program product tangibly embodied on a computer readable medium, the computer program product including instructions that, when executed by a processor, cause the processor to perform operations comprising:
determining a location of one or more fire detection devices within the building; and
generating a map that displays the location of one or more fire detection device,
wherein determining a location of one or more fire detection devices, a location of one or more fire suppression devices, and a location of one or more fire escape devices of a fire detection system within the building further comprises:
determining a probability of a fire in each room of the building;
determining a number of fire detection devices for the fire detection system within the room in response to the probability of the fire in each room;
determining a number of fire suppression devices for the fire detection system within the room in response to the probability of a fire in each room; and
determining a location of each of the fire detection devices within the room and a location of the fire suppression devices within each room.

* * * * *